United States Patent [19]

Lucey, Jr. et al.

[11] Patent Number: 5,520,752

[45] Date of Patent: May 28, 1996

[54] COMPOSITE SOLDERS

[75] Inventors: George K. Lucey, Jr., Burtonsville, Md.; James A. Wasynczuk, Bellflower, Calif.; Roger B. Clough, Rockville, Md.; Jennie S. Hwang, Moreland Hills, Ohio

[73] Assignee: The United States of America as represented by the Secretary of the Army, Washington, D.C.

[21] Appl. No.: 262,301

[22] Filed: Jun. 20, 1994

[51] Int. Cl.$^6$ .................... C22C 13/00; C22C 13/02
[52] U.S. Cl. .................... 148/400; 420/560; 420/561; 420/562; 420/557; 148/405; 428/614
[58] Field of Search .................... 420/557–562, 420/590; 428/614; 148/405, 400

[56] References Cited

U.S. PATENT DOCUMENTS

| | | | |
|---|---|---|---|
| 2,004,372 | 6/1935 | Luschenowsky | 420/560 |
| 2,250,099 | 7/1940 | Hensel | 75/245 |
| 3,563,732 | 2/1971 | Morisaki | 420/561 |
| 3,827,884 | 11/1972 | Morisaki | 420/561 |
| 4,409,333 | 10/1983 | Tosima et al. | 436/2 |
| 4,453,977 | 6/1984 | Burns et al. | 75/255 |
| 4,518,662 | 5/1985 | Listemann et al. | 428/675 |
| 4,650,548 | 3/1987 | Strube et al. | 204/15 |
| 4,778,772 | 10/1988 | Takahashi et al. | 437/31 |
| 4,824,009 | 4/1989 | Master et al. | 228/124 |
| 4,832,809 | 5/1989 | Hodes et al. | 204/192.15 |
| 5,011,658 | 4/1991 | Niedrich | 420/558 |
| 5,066,544 | 11/1991 | Betrabet et al. | 428/614 |
| 5,094,700 | 3/1992 | Sekhar | 148/12.9 |

FOREIGN PATENT DOCUMENTS 54-152493  11/1979  Japan.

OTHER PUBLICATIONS

McCormack et al., "Progress in the Design of New Lead–Free Solder Alloys," *J. O. M.*, vol. 45, No. 7, Jul. 1993, pp. 36–40.

Stone et al., Grain Boundaries and the Thermal Fatigue of Surface Mount Solder Joints, Smart VI Conference Proceeding, vol. 2, Jan. 1990, pp. 57–65.

Ho et al., Carbon Fiber Reinforced Tin–Lead Alloy As a Low Thermal Expansion Solder Preform, J. Mater. Res., vol. 5 No. 6, Jun. 1990, pp. 1266–1270.

Lea, A Scientific Guide to Surface Mount Technology, 1988, p. 333.

Primary Examiner—David L. Lacey
Assistant Examiner—Sean Vincent
Attorney, Agent, or Firm—Freda L. Krosnick; Muzio B. Roberto

[57] ABSTRACT

A solder composition and method of soldering using composite solders comprising a solder alloy and intermetallic filler particles. The intermetallic filler particles are lead-free, have high strength, wet and disperse well in solder joints, remain uniformly distributed and resist degradation on long-term aging. When added to commercial bulk or paste solders, the intermetallic particles reduce the lead content of solder joints by consuming volume in lead-tin solder, and improve the mechanical properties of the solder by inhibiting localized shear deformation and interfering with crack growth.

9 Claims, 6 Drawing Sheets

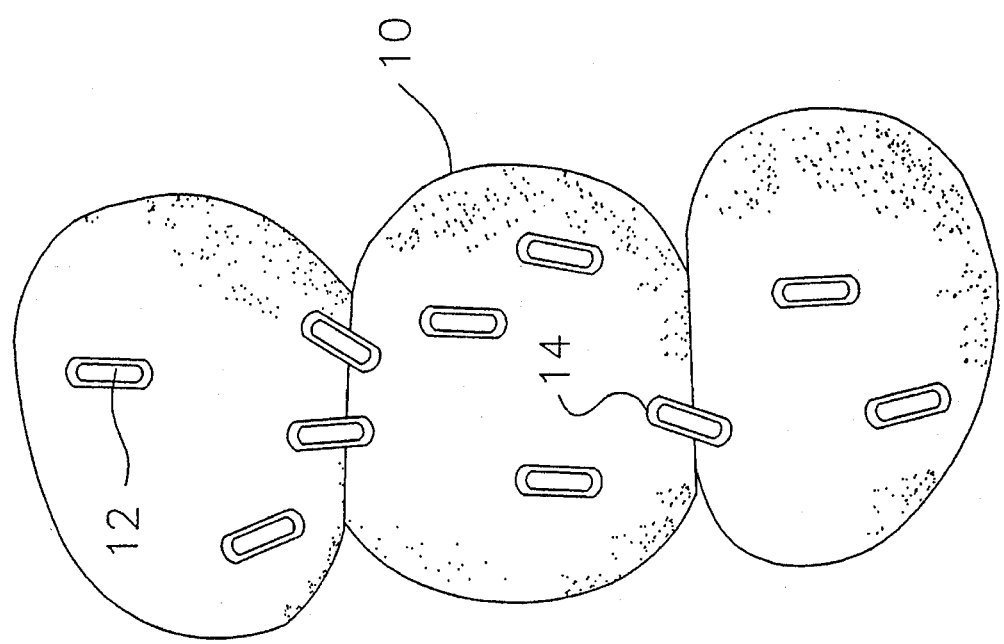

COMPOSITE SOLDERS

FIELD OF THE INVENTION

The present invention relates to solders and the soldering of metals, and more particularly to composite solders.

BACKGROUND OF THE INVENTION

Solder is a class of materials used to provide electrical, mechanical and thermal interconnections, and different solder alloys are marketed for different applications such as jewelry, plumbing and electronics. The most common solders are composed of lead and tin, with solders containing about 60% tin and about 40% lead being the principal type of solders used in soldering electronic assemblies.

One of the disadvantages arising from solders is their contribution to environmental pollution. Environmental pollution is caused by lead precipitation from solder joints in soldered materials that are discarded. For this reason, federal legislation has been introduced to reduce lead content in commercial solders.

A second disadvantage arising from solders is their poor mechanical properties due to the metallurgical structure of solder. Solder grains are bonded to base metals by intermetallic compounds. External loading on this matrix generates inter granular deformation and fracture both in the bulk solder and at the intermetallic interface. Improving the mechanical properties of solder would broaden its use into new applications, reduce manufacturing costs by eliminating the need for scientifically unfounded process controls, and reduce maintenance by extending product life cycles.

Poor mechanical properties were resolved in the thermoplastics industry by using composites wherein glass fillers in chopped fiber or woven cloth form were added to the resin. The purpose of adding such fillers was to interconnect sliding polymer chains and to disperse propagating cracks. A similar principal has been proposed for solder. For instance, a solder-matrix composite of tin-lead solder containing continuous unidirectional copper-plated carbon fibers to increase the strength of the solder is disclosed in Ho and Chung, Carbon Fiber Reinforced Tin-Lead Alloy as a Low Thermal Expansion Solder Preform, J. Mater. Res., Vol. 5, No. 6, June 1990, pp. 1266–70. This composite solder, however, is not practical for mass production applications such as electronics. In addition, the fiber composite was designed for low thermal expansion, and fibers would be unsuitable for penetrating crevice areas of solder joints.

The use of molybdenum particles as a filler in solder-matrix composites has also been attempted. Such attempts were unsuccessful because their distribution in the solder became nonuniform after remelting and solidification of the solder in the composite. Thus, molybdenum particles are not suitable for use in composite solders. See Ho and Chung, supra, at 1266.

SUMMARY AND OBJECTS OF THE INVENTION

In view of the foregoing limitations and shortcomings of the prior art compositions, as well as other disadvantages not specifically mentioned above, it should be apparent that there still exists a need in the art for composite solders that contribute less to environmental pollution and have improved mechanical properties.

It is, therefore, an object of this invention to fulfill that need by providing a composite solder wherein the filler material is lead-free.

It is another object of this invention to provide a composite solder wherein the filler material has high strength, wets and disperses well in solder joints, remains uniformly distributed and resists degradation on long-term aging.

Yet another object of this invention is to provide a means to measure the quality of wetting between the solder and the filler material.

Still another object of this invention is to provide a method for making said composite solders.

Briefly described, the aforementioned objects are accomplished according to the invention by providing a composition wherein intermetallic filler particles are mixed into commercial bulk or paste solders. Said filler particles are lead-free and consume volume in the solder thereby lowering the total lead content and reducing environmental pollution. In addition, they decrease inter-granular deformation and fracture in the bulk solder by broadening the areas of shear deformation during thermomechanical fatigue, where crack growth tends to occur. The result is more uniform, less severe deformation and cracking. Because the filler particles are very hard, cracks do not grow through them and crack growth is therefore decreased.

The intermetallic filler particles also wet and disperse well in solder joints, remain uniformly distributed, and resist degradation on long-term aging. A means to measure the quality of wetting between the solder and the filler particles is provided according to the invention wherein a thin film of a second intermetallic compound can be detected at the interface of the intermetallic filler particles and the solder if proper wetting has occurred.

With the foregoing and other objects, advantages and features of the invention that will become hereinafter apparent, the nature of the invention may be more clearly understood by reference to the following detailed description of the invention, the appended claims and to the several views illustrated in the drawings.

BRIEF DESCRIPTION OF THE DRAWINGS

FIG. 1 is a diagrammatic illustration of a composite solder containing intermetallic filler particles;

DETAILED DESCRIPTION OF THE INVENTION

Figure 2A:
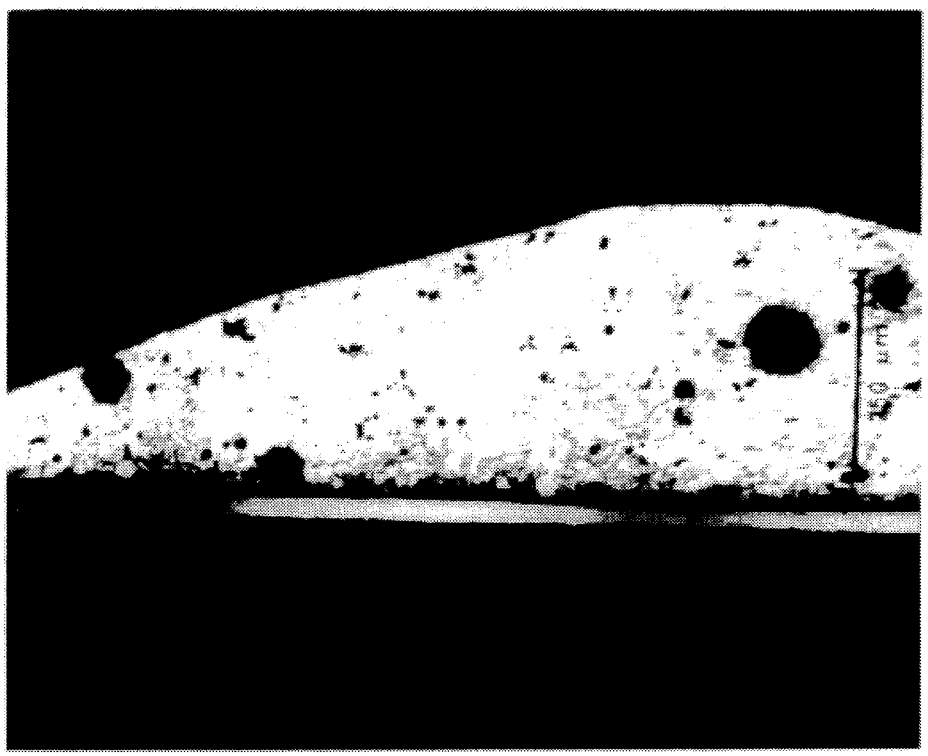
FIG. 2A is an electron photomicrograph showing a cross-sectional view of a composite solder joint fabricated using solder paste mixed with an intermetallic powder at a magnification of 100×.

Referring now in detail to the drawings there is illustrated in FIG. 1 the microstructure of a composite solder wherein intermetallic particles 12 are dispersed within solder grains 10. A thin layer 14 of a second intermetallic phase may form around the particles 12 indicating proper wetting during reflow. While the intermetallic filler particles 12 are shown in FIG. 1 as generally cylindrical, other shapes are possible. By mixing up to 30% by volume, preferably 0.5% to 30% by volume, and most preferably 5.0% to 30% by volume of the intermetallic filler particles into commercial bulk or paste solders, a new class of composite solders with new mechanical properties is created.

The intermetallic filler particles serve two main functions. First, since the filler particles are lead-free, they reduce the total lead content of each solder joint by consuming volume in Sn—Pb solder. Second, they improve the mechanical properties of the solder, particularly the resistance to thermomechanical fatigue, by inhibiting localized shear deformation and interfering with crack growth. During thermomechanical fatigue of eutectic Sn—Pb solder, shear deformation tends to be localized in narrow regions near eutectic grain boundaries and colony boundaries. Subsequent crack growth tends to occur in those regions where the deformation is localized and severe. Filler particles that are at and near the boundaries cause the regions of intense deformation to be broadened; filler particles away from the boundaries then act to further expand the regions of intense deformation. Consequently, the soldered joint deforms much more uniformly, and this improves the resistance to thermomechanical fatigue by interfering with crack growth. Because the intermetallic particles are very hard and the stress levels in the joint are low, cracks do not grow through the particles. By changing the composition, shape, dimensions and concentration of the intermetallic filler particles, the mechanical properties of the composite solder, including the thermal expansion coefficient, can be varied without degrading the melting point.

Figure 3:
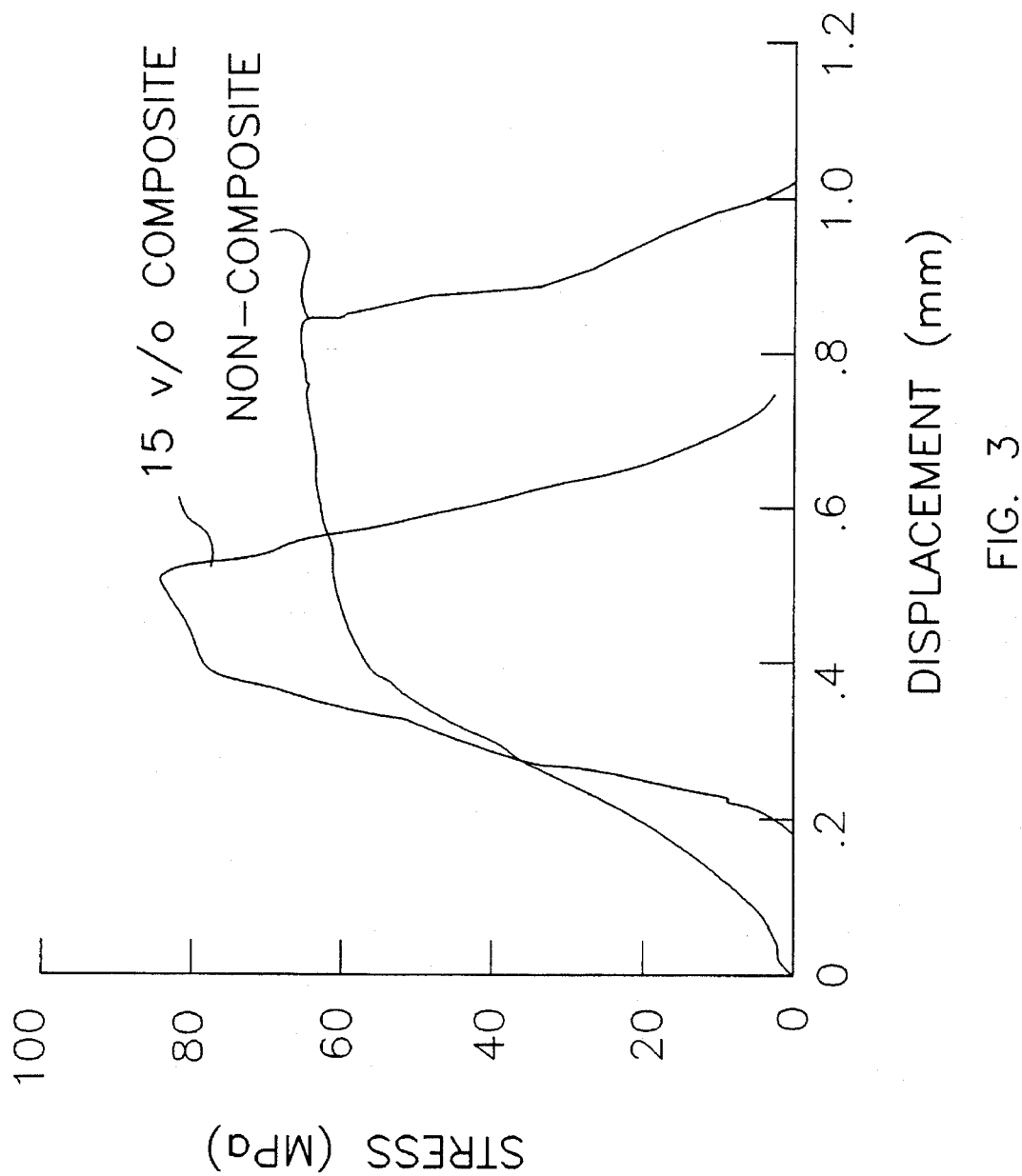
FIG. 3 is a graph comparing the strengths of composite and non-composite solders.
Figure 4:
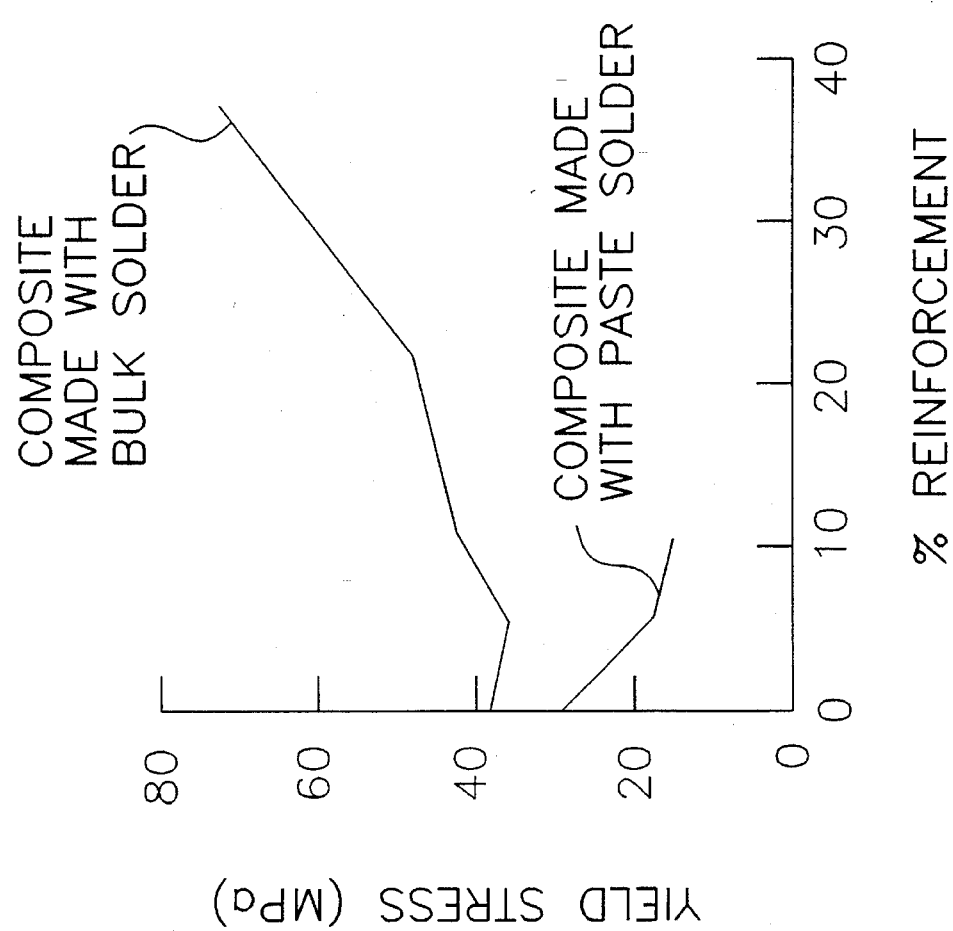
FIG. 4 is a graph showing the results of compression tests for composites made with bulk and paste solders.
Figure 5:
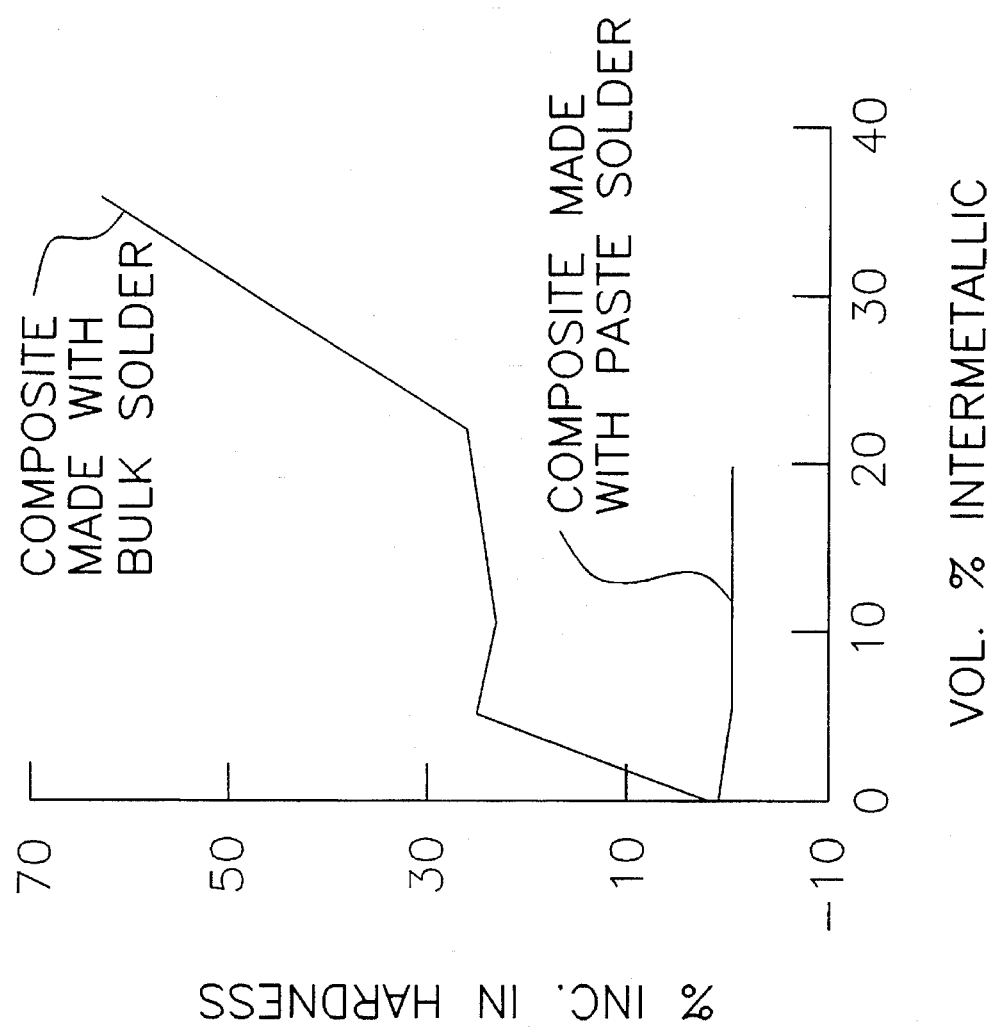
FIG. 5 is a graph comparing the percent increase in hardness with the volume percent of intermetallics in composites made with bulk and paste solders.

Compression testing of composite solders shows increased tensile and shear strength of the bulk solder, as shown in FIGS. 3–5. FIG. 3 compares the strength of 15 volume percent composite solder with non-composite solder. The ultimate strength of the composite solder is approximately 30% greater than that of the non-composite. FIG. 4 compares yield stress with percent reinforcement by intermetallic filler particles for composites made with bulk and paste solders. Yield strength is shown to increase in the composite made with bulk solder as the percentage of filler particles increases. FIG. 5 shows the relationship between the percent increase in hardness and the volume percent of intermetallic particles in composites made with bulk and paste solders. A composite made from bulk solder containing 30 volume percent intermetallic filler particles shows a 60% increase in hardness over a non-composite bulk solder.

In addition, the quality of particulate wetting can be gauged by the presence or absence of compositional changes such as the formation of a thin layer of a different intermetallic phase around the intermetallic filler particles. For example, if properly wetted during reflow, $Cu_3Sn$ particles in a composite solder will exhibit a thin layer of $Cu_6Sn_5$ at the solder interface after the soldering operation.

Several methods of fabricating different intermetallic particles in different shapes may be used, including melt casting of ingots, melt spinning of ribbon films, and melt atomization of spheroids. Spraying hot melt of the desired alloy into argon gas is a particularly economical method of producing intermetallic powders with minimal oxidation. Intermetallic compounds that may be used according to the invention include $Cu_3Sn$, $Cu_6Sn_5$, $Ni_3Sn_2$, $Ni_3Sn_4$, $Ni_3Sn_7$, AuSn, $AuSn_2$, $AuSn_4$, FeSn, $FeSn_2$ and $Ag_3Sn$.

EXAMPLE $Cu_6Sn_5$ particles were produced by spraying hot copper and tin melt into argon, yielding spheroid particles with siftable particle sizes ranging in diameter from 1–50 microns. X-ray diffraction and Auger spectroscopy demonstrated that the particles were the desired intermetallics.

To demonstrate solderability, the $Cu_6Sn_5$ powder was formed into solid bars using hot isostatic pressing techniques and then sessile drop experiments were performed. The results showed excellent solderability when the material was free of oxidation. The physical properties of the $Cu_6Sn_5$ intermetallic particles were also measured using hot isostatically pressed materials. The density of 8.37 g/cc is substantially equivalent to that of solder, and consequently it should remain well dispersed in paste solder, bulk solder or in a solder melt.

Composites were then fabricated using 30% by volume $Cu_6Sn_5$ particles in Sn62 and Sn60 paste solders and Sn60 bulk solder. The composite solders were used to form solder joints by infrared reflow and hot-iron melting. Wetting and dispersion of the intermetallic particles were seen to be good using scanning electron microscopy, as seen in FIGS. 2A–2D.

Figure 2B:
FIG. 2B is an electron photomicrograph of the cross-sectional view of the solder joint of FIG. 2A at a magnification of 500×.
Figure 2C:
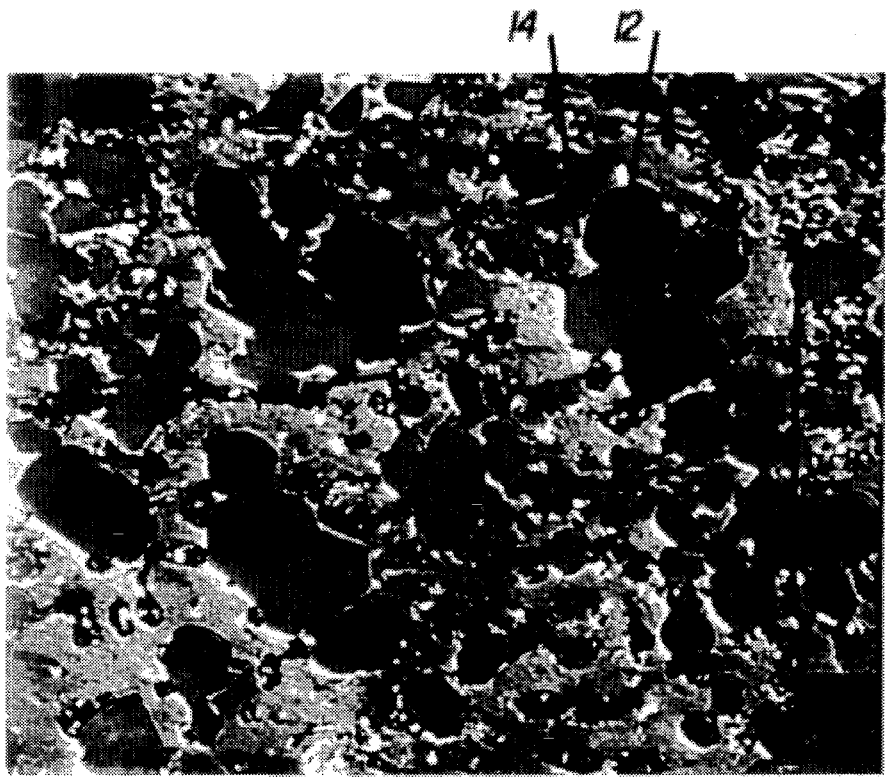
FIG. 2C is an electron photomicrograph of the cross-sectional (SEM backscatter) view of the solder joint of FIG. 2A at a magnification of 2000×.
Figure 2D:
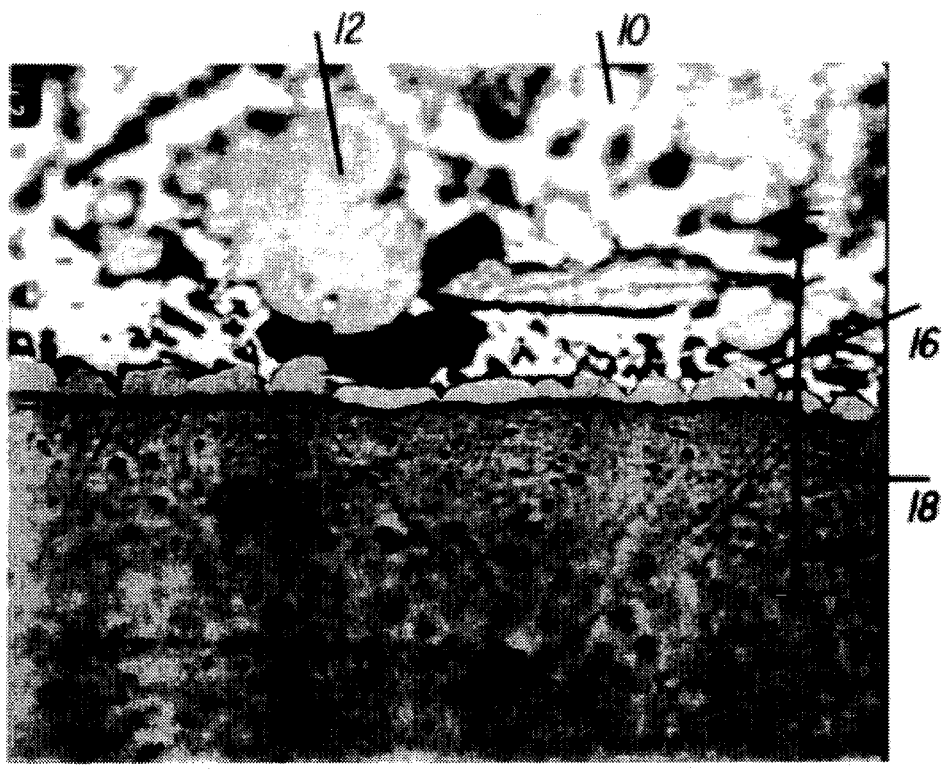
FIG. 2D is an electron photomicrograph of the cross-sectional view of the solder joint of FIG. 2A showing both the intermetallics growing naturally at the solder-base metal interface and the artificially formed intermetallic filler particles at a magnification of 2000×.

FIG. 2A is a cross section, magnified 100×, of a composite solder joint fabricated by infrared reflow of a eutectic solder paste comprising by weight 62% Sn, 36% Pb, 2% Ag mixed with 30% by volume of $Cu_6Sn_5$ powder. FIG. 2B is a 500× view of the solder joint showing the filler particles 12 to be well dispersed. FIG. 2C demonstrates excellent wetting of the fillers in an SEM backscatter 2000× view of the solder joint, showing the formation of a thin layer of a second intermetallic phase 14 around the filler particles 12. FIG. 2D, also a 2000× view of the solder joint, shows the intermetallic layer 16 growing naturally at the interface of the base metal 18 and the solder grains 10, as well as the artificially formed intermetallic filler particles 12 dispersed within the solder grains 10.

It is also possible to use lead free solder with the intermetallic particles. Examples of lead free solder include the solder described in Table 1. The composition of the different elements is chosen to add up to 100%. The lead-free tin alloy solders can be used in either paste or bulk form.

TABLE 1

| Wt. % Sn | Wt. % Ag | Wt. % In | Wt. % Bi | Wt. % Cu |
|---|---|---|---|---|
| 87–89 | 2.7–3.9 | 3.3–9.3 | — | — |
| 84–93 | 2.4–3.6 | 1.5–8.8 | 1.5–4.8 | — |
| 86–94 | 0.3–0.7 | 2.5–9.0 | — | 3.0–5.0 |
| 87–97 | 2.5–4.5 | — | 1.0–4.8 | — |
| 90–94 | 0.3–0.5 | — | 2.0–3.0 | 3.0–5.0 |

Composite solders were then fabricated using 30% by volume $Cu_6Sn_5$ particles in the lead-free tin solders described in Table 1. These lead-free composite solders were used to form solder joints by infra-red and hot iron melting. Wetting and dispersion of the intermetallic particles was seen to be good. The tensile and shear strength of the lead-free tin composites is similar to the composite solders with lead.

Although certain presently preferred embodiments of the invention have been described herein, it will be apparent to those skilled in the art to which the invention pertains that variations and modifications of the described embodiment may be made without departing from the spirit and scope of the invention. Accordingly, it is intended that the invention be limited only to the extent required by the appended claims and the applicable rules of law.

What is claimed is:

1. A soldering compound, comprising
   a lead-free solder alloy component selected from the group consisting of Sn—Ag—In; Sn—Ag—In—Bi; Sn—Ag—Bi; and Sn—Ag—Bi—Cu, the solder alloy component having
   Sn in amount of about 86 to about 97%, Ag in an an amount of about 0.3 to about 4.5%, In in an amount of 0.00 to about 9.3, Bi in an amount of 0.00 to about 4.8%, and Cu in an amount of 0.00 to about 5% on a weight basis, and
   the balance being an intermetallic filler selected from the group consisting of $Cu_3Sn$, $Cu_6Sn_5$, $Ni_3Sn_2$, $Ni_3Sn_4$, $Ni_3Sn_7$, AuSn, $AuSn_2$, $AuSn_4$, FeSn, $FeSn_2$, and $Ag_3Sn$.

2. The compound of claim 1, wherein the solder alloy component comprises 87–89% Sn, 2.7–3.9% Ag, and 3.3–9.3% In.

3. The compound of claim 1, wherein the solder alloy component comprises 89–93% Sn, 2.4–3.6% Ag, 1.5–8.8% In, and 1.5–4.8% Bi.

4. The compound of claim 1, wherein the solder alloy component comprises 86–94% Sn, 0.3–0.7% Ag, 2.5–5 9.0% In, and 3.0–5.0% Cu.

5. The compound of claim 1, wherein the solder alloy component comprises 87–97% Sn, 2.5–4.5% Ag, and 1.0–4.8% Bi.

6. The compound of claim 1, wherein the solder alloy component comprises 90–94% Sn, 0.3–0.5% Ag, 2.0–3.0% Bi, and 3.0–5.0% Cu.

7. The compound of claim 1, wherein the intermetallic filler comprises 30% by volume of the solder compound.

8. The solder compound of claim 1 wherein said solder alloy component is in the form of a bulk solder.

9. The solder compound of claim 1 wherein said solder alloy component is in the form of a paste solder.

* * * * *